(12) United States Patent
Lee et al.

(10) Patent No.: US 12,260,929 B2
(45) Date of Patent: Mar. 25, 2025

(54) SEMICONDUCTOR DEVICE INCLUDING INTERNAL TRANSMISSION PATH AND STACKED SEMICONDUCTOR DEVICE USING THE SAME

(71) Applicant: SK hynix Inc., Gyeonggi-do (KR)

(72) Inventors: Jinhyung Lee, Gyeonggi-do (KR);
Myeong Jae Park, Gyeonggi-do (KR);
Su Hyun Oh, Gyeonggi-do (KR);
Chang Kwon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/587,961

(22) Filed: Feb. 27, 2024

(65) Prior Publication Data

US 2024/0194232 A1 Jun. 13, 2024

Related U.S. Application Data

(63) Continuation of application No. 17/554,226, filed on Dec. 17, 2021, now Pat. No. 11,942,181.

(30) Foreign Application Priority Data

Jul. 20, 2021 (KR) .......................... 10-2021-0094719

(51) Int. Cl.
*G11C 7/10* (2006.01)
*G11C 5/06* (2006.01)

(52) U.S. Cl.
CPC .............. *G11C 7/1072* (2013.01); *G11C 5/06* (2013.01); *G11C 7/1048* (2013.01); *G11C 7/106* (2013.01); *G11C 7/1087* (2013.01)

(58) Field of Classification Search
CPC ...... G11C 7/1072; G11C 7/106; G11C 7/1087
USPC .......................................................... 365/244
See application file for complete search history.

(56) References Cited

U.S. PATENT DOCUMENTS

| | | | |
|---|---|---|---|
| 8,198,951 B2 * | 6/2012 | Dong ...................... | H01L 24/49 375/257 |
| 2018/0006847 A1 * | 1/2018 | Jia ...................... | H04L 25/03885 |

* cited by examiner

*Primary Examiner* — Anthan Tran
(74) *Attorney, Agent, or Firm* — IP & T GROUP LLP

(57) ABSTRACT

A semiconductor device comprising: a first or a second path configured to transmit a first signal which swings between a ground level and a first level, a third path configured to transmit a second signal which swings between the ground level and a second level lower than the first level, a transmitter configured to output received the first signal through the first or second path as the second signal to the third path, and initialize in response to an enable signal, and a receiver configured to output received the second signal through the third path as the first signal through the first or second path, determine level of the second signal through a reference level that is regulated according to a fed-back level of an output terminal thereof, and initialize in response to the enable signal.

15 Claims, 10 Drawing Sheets

SEMICONDUCTOR DEVICE INCLUDING INTERNAL TRANSMISSION PATH AND STACKED SEMICONDUCTOR DEVICE USING THE SAME

CROSS-REFERENCE TO RELATED APPLICATION

This application is a continuation of U.S. patent application Ser. No. 17/554,226 filed on Dec. 17, 2021, which claims priority under 35 U.S.C. § 119 to Korean Patent Application No. 10-2021-0094719 filed on Jul. 20, 2021, which is incorporated herein by reference in its entirety.

BACKGROUND

1. Field

Various embodiments of the present disclosure relate to a semiconductor device, and particularly, to a semiconductor device including an internal transmission path and a stacked semiconductor device using the same.

2. Discussion of the Related Art

A semiconductor device includes a semiconductor memory device such as a dynamic random access memory (DRAM), and is being widely used in various electronic systems. Such a semiconductor device has been continuously developed to satisfy an operating speed and processing capability required in a system as the system becomes smaller and the performance thereof is improved. In particular, in the case of the semiconductor memory device, various technologies are being developed to store a large amount of data and process the data at a high speed.

Technologies for developing a high bandwidth memory (HBM) device are some of the various technologies. In order to develop such a semiconductor memory device as a semiconductor memory device capable of processing a large amount of data at a high speed, first, a semiconductor chip (or die) may be manufactured in such a way to be highly integrated. That is, a larger number of memory cells are manufactured by being integrated within a limited space of a semiconductor chip (or die). However, limitations in manufacturing process technologies exist in highly integrating memory cells. As a result, such limitations may be overcome by stacking manufactured semiconductor chips (or dies) and packaging them into a 3D structure.

In the case of the high bandwidth memory device, since a scheme of increasing the number of channels and processing data of the channels in parallel is used to increase a bandwidth, thousands of units of internal I/Os may exist. Therefore, a problem may be caused in that the higher a swing level of a signal transmitted through the internal I/O is, that is, a level of a power supply voltage used in the internal I/O, the more the magnitude of power consumption increases.

SUMMARY

Various embodiments of the present disclosure are directed to a semiconductor device capable of minimizing the swing width of a signal transferred through an internal transmission path included in the semiconductor device, thereby minimizing the magnitude of power consumption.

Also, various embodiments of the present disclosure are directed to a stacked semiconductor device capable of minimizing the swing width of data transferred through an internal transmission path of a semiconductor device included in the stacked semiconductor device, thereby minimizing the magnitude of power consumption.

It is to be understood that technical objects to be achieved by the disclosure are not limited to the aforementioned technical objects and other technical objects which are not mentioned herein will be apparent from the following description to one of ordinary skill in the art to which the disclosure pertains.

In accordance with an embodiment of the present invention, a semiconductor device may include: a first transmission path connected to a first interface and configured to transmit a first signal which swings between a ground level and a first voltage level; a second transmission path connected to a second interface and configured to transmit the first signal; a third transmission path configured to transmit a second signal which swings between the ground level and a second voltage level lower than the first voltage level; a transmitter configured to: receive the first signal through the first or second transmission path, output the received first signal as the second signal to the third transmission path, and initialize an output terminal thereof in response to an enable signal; and a receiver configured to: receive the second signal through the third transmission path, output the received second signal as the first signal through the first or second transmission path, determine a logic level of the second signal, which is applied to an input terminal thereof, through a reference voltage level that is regulated according to a fed-back logic level of an output terminal thereof, and initialize the output terminal thereof in response to the enable signal.

In accordance with an embodiment of the present invention, a semiconductor device may include: a first circuit configured to generate a transfer signal by decreasing an amplitude of an input signal provided through a first interface and configured to transfer the transfer signal through a transfer path; and a second circuit configured to generate an output signal by increasing an amplitude of the transfer signal transferred through the transfer path and configured to output the output signal through a second interface. The second circuit may include a decision feedback equalizer (DFE) configured to adjust a reference level for determining a level of the transfer signal.

In the present technology, in order to minimize the swing width of a signal transferred through an internal transmission path included in a semiconductor device, a signal may be transmitted using an N-over-N driver which pull-up and pull-down drives the signal through NMOS transistors, and a signal may be received using a strong-arm latch type sense amplifier which receives the signal through PMOS transistors. Also, in order to compensate for inter-symbol interference (ISI) of the signal received through the internal transmission path, a decision feedback equalizer (DFE) may be used.

In addition, in the present technology, since a circuit for transmitting a signal and a circuit for receiving a signal are included in one semiconductor device, the circuit for transmitting a signal and the circuit for receiving a signal may be simultaneously initialized in response to one enable signal.

Due to this fact, the semiconductor device to which the present technology is applied may stably transmit/receive a signal even in a state in which the swing width of a signal transmitted through a transmission path included in the semiconductor device is minimized, and may minimize the magnitude of power consumption.

Further, by applying the semiconductor device, to which the present technology is applied, to a stacked semiconductor device, it is possible to stably transmit/receive data in a state in which the swing width of data transmitted through a transmission path included in the stacked semiconductor device is minimized, and to minimize the magnitude of power consumption in the stacked semiconductor device.

DETAILED DESCRIPTION

Figure 1:
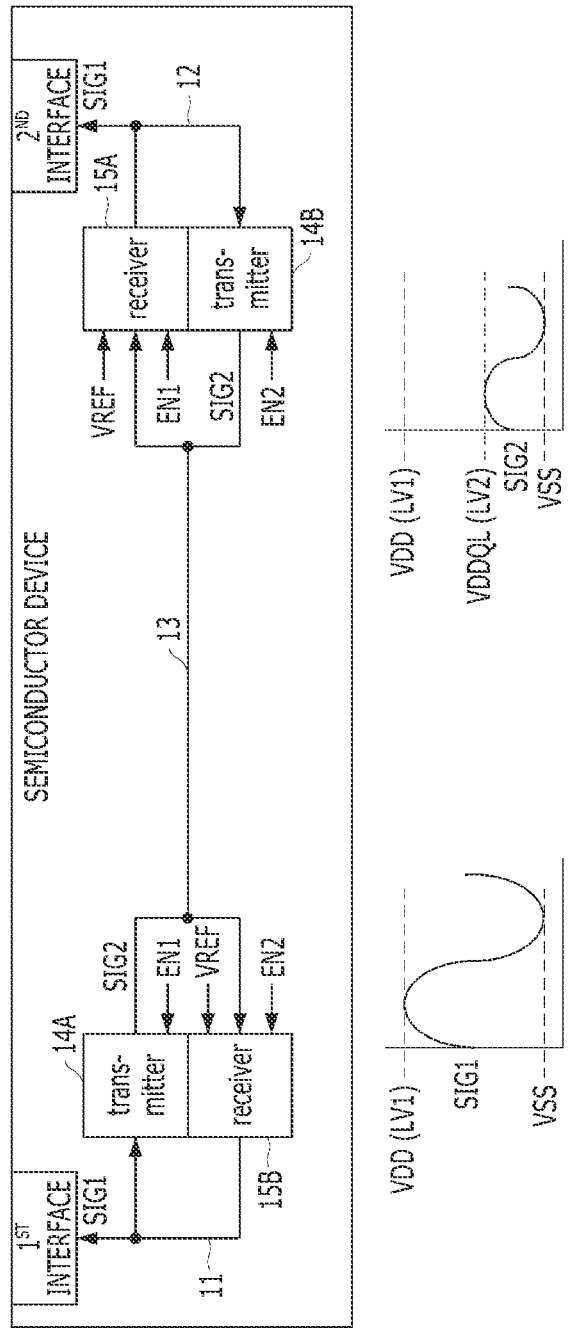
FIG. 1 illustrates an example of a semiconductor device in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., a field programmable gate array (FPGA) or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 illustrates an example of a semiconductor device in accordance with an embodiment of the present disclosure.

A semiconductor device SEMICONDUCTOR DEVICE illustrated in FIG. 1 may mean one integrated circuit (IC) individually sawn on a semiconductor wafer. That is, the semiconductor device SEMICONDUCTOR DEVICE illustrated in FIG. 1 may mean one semiconductor chip or semiconductor die which is physically separated.

In detail, referring to FIG. 1, the semiconductor device SEMICONDUCTOR DEVICE in accordance with the embodiment of the present disclosure may include a first interface $1^{ST}$ INTERFACE, a second interface $2^{ND}$ INTERFACE, a first transmission path 11, a second transmission path 12, a third transmission path 13, transmitters 14A and 14B, and receivers 15A and 15B.

The first interface $1^{ST}$ INTERFACE and the second interface $2^{ND}$ INTERFACE may mean pads or pins for inputting/outputting signals in the semiconductor device SEMICONDUCTOR DEVICE.

The first transmission path 11 may transmit a first signal SIG1 which swings between the level of a ground voltage VSS and a first voltage level LV1, and may be connected to the first interface $1^{ST}$ INTERFACE.

Like the first transmission path 11, the second transmission path 12 may transmit the first signal SIG1 which swings between the level of the ground voltage VSS and the first voltage level LV1, and may be connected to the second interface $2^{ND}$ INTERFACE.

Unlike the first and second transmission paths 11 and 12, the third transmission path 13 may transmit a second signal SIG2 which swings between the level of the ground voltage VSS and a second voltage level LV2 lower than the first voltage level LV1.

The transmitters 14A and 14B may receive the first signal SIG1 through the first transmission path 11 or the second transmission path 12 and output the second signal SIG2 to the third transmission path 13.

The receivers 15A and 15B may receive the second signal SIG2 through the third transmission path 13 and output the first signal SIG1 to the first transmission path 11 or the second transmission path 12. Each of the receivers 15A and 15B may be fed back with a logic level of an output terminal thereof, and may determine a logic level of the second signal SIG2, applied to an input terminal thereof, through a reference voltage level whose level is regulated in correspondence to the fed-back logic level of the output terminal. That is, each of the receivers 15A and 15B may be fed back with and check a logic level of the first signal SIG1 outputted to the first transmission path 11 or the second transmission path 12 through the output terminal thereof, and may regulate, according to a checking result, the reference voltage level for determining a logic level of the second signal SIG2 applied to the input terminal thereof through the third transmission path 13. Accordingly, each of the receivers 15A and 15B may perform the operation of a decision feedback equalizer (DFE) which regulates the reference voltage level serving as a reference when determining a logic level of a currently inputted second signal SIG2, depending on a logic level of a previously inputted second signal SIG2.

According to an embodiment, the first voltage level LV1 may mean the level of a first power supply voltage VDD. For example, the first voltage level LV1 may be 1.1V. According to an embodiment, the second voltage level LV2 may mean the level of a second power supply voltage VDDQL. For example, the second voltage level LV2 may be 0.4V. According to an embodiment, the reference voltage level may mean a voltage level that may be varied in correspondence to the fed-back logic level of the output terminal on the basis of the level of a reference voltage VREF which has a voltage level obtained by dividing the second voltage level LV2 by 2. For example, the reference voltage level may be 0.2V±20 mV.

In summary, the first signal SIG1 and the second signal SIG2 may be signals which have different swing levels but the same meaning values. For example, the first signal SIG1 transferred to the transmitter 14A or 14B through the first transmission path 11 or the second transmission path 12 sequentially has values of 'a b c d.' The transmitter 14A or 14B may generate the second signal SIG2 which has the same value as but a different swing level from the first signal SIG1 inputted thereto, and may drive the second signal SIG2 to the third transmission path 13. Therefore, the second signal SIG2 received by the receiver 15A or 15B through the third transmission path 13 may sequentially have the values of 'a b c d.'

For reference, although not illustrated in detail in the drawing, each of the receivers 15A and 15B may sequentially receive the second signal SIG2 according to a clock signal (CKB).

As described above, the semiconductor device SEMICONDUCTOR DEVICE in accordance with the embodiment of the present disclosure may keep a swing level of the second signal SIG2 transferred through the third transmission path 13 lower than a swing level of the first signal SIG1 transferred through the first transmission path 11 or the second transmission path 12. Accordingly, as the length of the third transmission path 13 is longer than the length of each of the first transmission path 11 and the second transmission path 12 in the semiconductor device SEMICONDUCTOR DEVICE, the magnitude of power consumption may be greatly reduced.

Each of the transmitters 14A and 14B may initialize an output terminal thereof, that is, an output terminal thereof connected to the third transmission path 13, to a preset logic level in response to each of enable signals EN1 and EN2. For example, each of the transmitters 14A and 14B may initialize the output terminal thereof, connected to the third transmission path 13, to the level of the ground voltage VSS in response to toggles of each of the enable signals EN1 and EN2.

Also, each of the receivers 15A and 15B may initialize the output terminal thereof, that is, the output terminal thereof connected to each of the first transmission path 11 and the second transmission path 12, to a preset logic level in response to each of the enable signals EN1 and EN2. For example, each of the receivers 15A and 15B may initialize the output terminal thereof, connected to each of the first transmission path 11 and the second transmission path 12, to the level of the ground voltage VSS in response to toggles of each of the enable signals EN1 and EN2.

Namely, the pair of the transmitter and receiver 14A and 15A or 14B and 15B which are physically separated from each other with the third transmission path 13 interposed therebetween may initialize the output terminals thereof to the level of the ground voltage VSS in response to the same enable signal EN1 or EN2.

Each of the receivers 15A and 15B is fed back with and uses the logic level of the output terminal thereof to regulate the reference voltage level. Thus, when the output terminal thereof is initialized in response to the enable signal EN1 or EN2, the logic level of the output terminal thereof fed back to regulate the reference voltage level may always have the preset logic level. For example, when each of the receivers 15A and 15B is initialized in response to toggling of each of the enable signals EN1 and EN2, the logic level of the output terminal thereof fed back to regulate the reference voltage level may always have the level of the ground voltage VSS.

In summary, in response to the enable signals EN1 and EN2, the transmitters 14A and 14B may initialize the output terminals thereof, connected to the third transmission path 13, to the preset logic level, and the receivers 15A and 15B may initialize the output terminals thereof whose levels are fed back to the input terminals thereof connected to the third transmission path 13, to the preset logic level. Through this, the transmitters 14A and 14B and the receivers 15A and 15B, which are physically separated from each other with the third transmission path 13 interposed therebetween, may be initialized to a state the same as a state in which the transmitters 14A and 14B and the receivers 15A and 15B transmit/receive signals having the preset logic levels (even though the transmitters 14A and 14B and the receivers 15A and 15B do not actually transmit/receive signals), at initialization time points corresponding to the enable signals EN1 and EN2.

The reason why, as described above, the transmitters 14A and 14B and the receivers 15A and 15B may be simultaneously initialized in response to the enable signals EN1 and EN2 is because the transmitters 14A and 14B and the receivers 15A and 15B are components which are included in the same semiconductor device SEMICONDUCTOR DEVICE. That is, since the transmitters 14A and 14B and the receivers 15A and 15B are components which are included in one semiconductor device SEMICONDUCTOR DEVICE, the transmitters 14A and 14B and the receivers 15A and 15B may receive the enable signals EN1 and EN2 at the same time points, and may be initialized at the same time points.

Unlike the illustration, when the transmitters 14A and 14B and the receivers 15A and 15B are components which exist in different semiconductor devices, a difference cannot help but exist between time points at which the enable signals EN1 and EN2 reach the transmitters 14A and 14B and the receivers 15A and 15B, and thus, it is impossible for the transmitters 14A and 14B and the receivers 15A and 15B to be simultaneously initialized.

Figure 2:
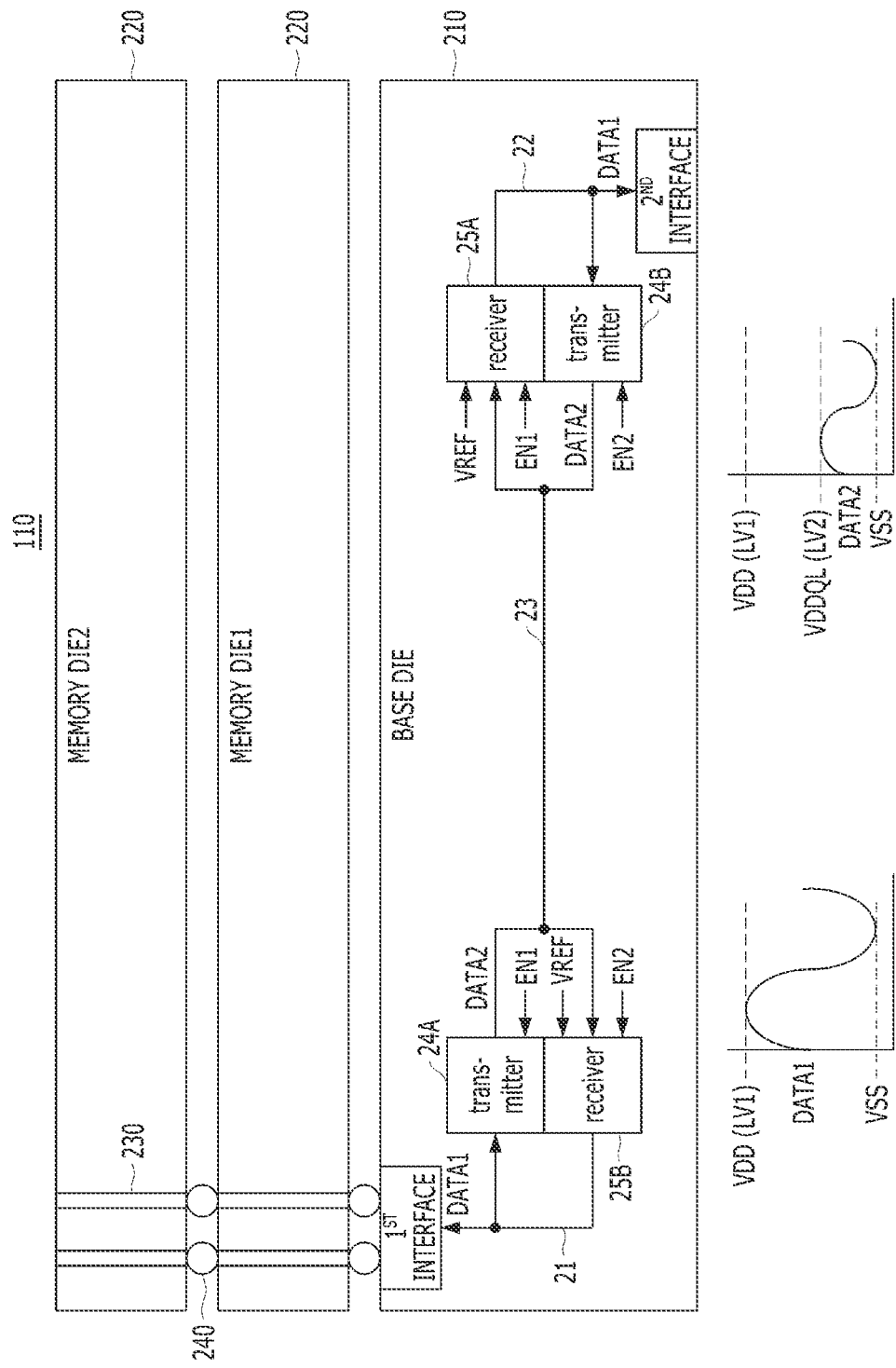
FIG. 2 illustrates an example of a stacked semiconductor device in accordance with an embodiment of the present disclosure to which the semiconductor device illustrated in FIG. 1 is applied.

FIG. 2 illustrates an example of a stacked semiconductor device in accordance with an embodiment of the present disclosure to which the semiconductor device illustrated in FIG. 1 is applied.

Referring to FIG. 2, a stacked semiconductor device 110 in accordance with an embodiment of the present disclosure may include a base die (BASE DIE) 210 and a plurality of memory dies (MEMORY DIE1 and MEMORY DIE2) 220 which are stacked on the base die 210.

The base die 210 and the plurality of memory dies 220 may be electrically connected through through-silicon vias (TSVs), that is, through electrodes 230, which are formed in and vertically pass through the plurality of memory dies 220, and micro bumps 240, and thereby, may transmit and receive signals.

A memory cell array for storing data and a data storage space such as a memory register may be disposed in each of the plurality of memory dies 220. On the other hand, circuits for transmitting data between the plurality of memory dies 220 and a memory controller outside the stacked semiconductor device 110 may be disposed in the base die 210. When the stacked semiconductor device 110 is configured in this type, the number of input/output units may be greatly increased, which may be advantageous in increasing a bandwidth. As an example of the stacked semiconductor device 110 configured in this type, there may be a high bandwidth memory (HBM) device.

For reference, FIG. 2 illustrates that the number of the plurality of stacked memory dies 220 is two. However, this is an example, and it may be envisaged that a larger number of memory dies may be stacked.

The base die 210 may be a component corresponding to the semiconductor device SEMICONDUCTOR DEVICE illustrated in FIG. 1. An operation of the base die 210 to transmit data between the plurality of memory dies 220 and the memory controller outside the stacked semiconductor device 110 may be similar to that of the semiconductor device SEMICONDUCTOR DEVICE illustrated in FIG. 1.

In detail, the base die 210 may include a first interface 1^ST INTERFACE, a second interface 2^ND INTERFACE, a first transmission path 21, a second transmission path 22, a third transmission path 23, transmitters 24A and 24B, and receivers 25A and 25B.

The first interface $1^{ST}$ INTERFACE may mean a buffer or a pad for inputting/outputting data between the base die 210 and the plurality of memory dies 220, and as illustrated in the drawing, may be connected to the through electrodes 230 through the micro bumps 240.

The second interface $2^{ND}$ INTERFACE may mean a buffer or a pad for inputting/outputting data between the base die 210 and the memory controller outside the stacked semiconductor device 110, and although not illustrated in detail in the drawing, may be electrically connected to the memory controller through a package substrate.

The first transmission path 21 may transmit first data DATA1 which swings between the level of a ground voltage VSS and a first voltage level LV1, and may be electrically connected to the plurality of memory dies 220 through the first interface $1^{ST}$ INTERFACE.

Like the first transmission path 21, the second transmission path 22 may transmit the first data DATA1 which swings between the level of the ground voltage VSS and the first voltage level LV1, and may be electrically connected to the memory controller outside the stacked semiconductor device 110 through the second interface 2^ND INTERFACE.

Unlike the first and second transmission paths 21 and 22, the third transmission path 23 may transmit second data DATA2 which swings between the level of the ground voltage VSS and a second voltage level LV2 lower than the first voltage level LV1.

The transmitters 24A and 24B may receive the first data DATA1 through the first transmission path 21 or the second transmission path 22 and output the second data DATA2 to the third transmission path 23.

The receivers 25A and 25B may receive the second data DATA2 through the third transmission path 23 and output the first data DATA1 to the first transmission path 21 or the second transmission path 22. Each of the receivers 25A and 25B may be fed back with a logic level of an output terminal thereof, and may determine a logic level of the second data DATA2, applied to an input terminal thereof, through a reference voltage level whose level is regulated in correspondence to the fed-back logic level of the output terminal. That is, each of the receivers 25A and 25B may be fed back with and check a logic level of the first data DATA1 outputted to the first transmission path 21 or the second transmission path 22 through the output terminal thereof, and may regulate, according to a checking result, the reference voltage level for determining a logic level of the second data DATA2 applied to the input terminal thereof through the third transmission path 23. Accordingly, each of the receivers 25A and 25B may perform the operation of a decision feedback equalizer (DFE) which regulates the reference voltage level serving as a reference when determining a logic level of a currently inputted second data DATA2, depending on a logic level of a previously inputted second data DATA2.

According to an embodiment, the first voltage level LV1 may mean the level of a first power supply voltage VDD. For example, the first voltage level LV1 may be 1.1V. According to an embodiment, the second voltage level LV2 may mean the level of a second power supply voltage VDDQL. For example, the second voltage level LV2 may be 0.4V. According to an embodiment, the reference voltage level may mean a voltage level that may be varied in correspondence to the fed-back logic level of the output terminal on the basis of the level of a reference voltage VREF which has a voltage level obtained by dividing the second voltage level LV2 by 2. For example, the reference voltage level may be 0.2V±20 mV.

In summary, the first data DATA1 and the second data DATA2 may be data which have different swing levels but the same meaning values. For example, the first data DATA1 transferred to the transmitter 24A or 24B through the first transmission path 21 or the second transmission path 22 sequentially has values of 'a b c d.' The transmitter 24A or 24B may generate the second data DATA2 which has the same value as but a different swing level from the first data DATA1 inputted thereto, and may drive the second data DATA2 to the third transmission path 23. Therefore, the second data DATA2 received by the receiver 25A or 25B through the third transmission path 23 may sequentially have the values of 'a b c d.'

For reference, although not illustrated in detail in the drawing, each of the receivers 25A and 25B may sequentially receive the second data DATA2 according to a clock signal (CKB).

As described above, the base die 210 in accordance with the embodiment of the present disclosure may keep a swing level of the second data DATA2 transferred through the third transmission path 23 lower than a swing level of the first data DATA1 transferred through the first transmission path 21 or the second transmission path 22. Accordingly, as the length of the third transmission path 23 is longer than the length of each of the first transmission path 21 and the second transmission path 22 in the base die 210, the magnitude of power consumption may be greatly reduced.

Each of the transmitters 24A and 24B may initialize an output terminal thereof, that is, an output terminal thereof connected to the third transmission path 23, to a preset logic level in response to each of enable signals EN1 and EN2. For example, each of the transmitters 24A and 24B may initialize the output terminal thereof, connected to the third transmission path 23, to the level of the ground voltage VSS in response to toggles of each of the enable signals EN1 and EN2.

Also, each of the receivers 25A and 25B may initialize the output terminal thereof, that is, the output terminal thereof connected to each of the first transmission path 21 and the second transmission path 22, to a preset logic level in response to each of the enable signals EN1 and EN2. For example, each of the receivers 25A and 25B may initialize the output terminal thereof, connected to each of the first transmission path 21 and the second transmission path 22, to the level of the ground voltage VSS in response to toggles of each of the enable signals EN1 and EN2.

Namely, the pair of the transmitter and receiver 24A and 25A or 24B and 25B which are physically separated from each other with the third transmission path 23 interposed therebetween may initialize the output terminals thereof to the level of the ground voltage VSS in response to the same enable signal EN1 or EN2.

Each of the receivers 25A and 25B is fed back with and uses the logic level of the output terminal thereof to regulate the reference voltage level. Thus, when the output terminal thereof is initialized in response to the enable signal EN1 or EN2, the logic level of the output terminal thereof fed back to regulate the reference voltage level may always have the preset logic level. For example, when the output terminal of each of the receivers 25A and 25B is initialized in response to toggling of the enable signal EN1 or EN2, the logic level of the output terminal thereof fed back to regulate the reference voltage level may always have the level of the ground voltage VSS.

In summary, in response to the enable signals EN1 and EN2, the transmitters 24A and 24B may initialize the output terminals thereof, connected to the third transmission path 23, to the preset logic level, and the receivers 25A and 25B may initialize the output terminals thereof whose levels are fed back to the input terminals thereof connected to the third transmission path 23, to the preset logic level. Through this, the transmitters 24A and 24B and the receivers 25A and 25B, which are physically separated from each other with the third transmission path 23 interposed therebetween, may be initialized to a state the same as a state in which the transmitters 24A and 24B and the receivers 25A and 25B transmit/receive data having the preset logic levels (even though the transmitters 24A and 24B and the receivers 25A and 25B do not actually transmit/receive data), at initialization time points corresponding to the enable signals EN1 and EN2.

The reason why, as described above, the transmitters 24A and 24B and the receivers 25A and 25B may be simultaneously initialized in response to the enable signals EN1 and EN2 is because all of the transmitters 24A and 24B and the receivers 25A and 25B are components which are included in the base die 210. That is, since the transmitters 24A and 24B and the receivers 25A and 25B are components which are included in one base die 210, the transmitters 24A and 24B and the receivers 25A and 25B may receive the enable signals EN1 and EN2 at the same time points, and may be initialized at the same time points.

Unlike the illustration, when the transmitters 24A and 24B are components which are included in the base die 210 and the receivers 25A and 25B are components which exist in the plurality of memory dies 220, a difference cannot help but exist between time points at which the enable signals EN1 and EN2 reach the transmitters 24A and 24B and the receivers 25A and 25B, and thus, it is impossible for the transmitters 24A and 24B and the receivers 25A and 25B to be simultaneously initialized.

Figure 3:
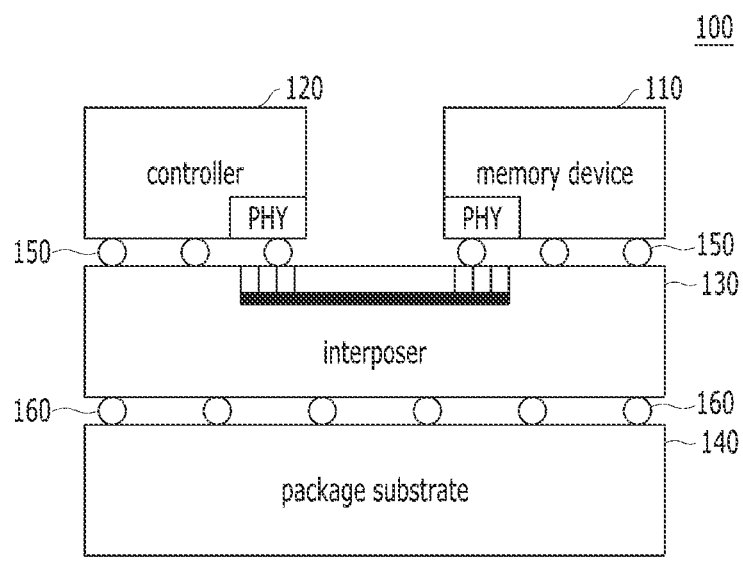
FIG. 3 illustrates an example of a semiconductor system in accordance with an embodiment of the present disclosure to which the stacked semiconductor device illustrated in FIG. 2 is applied.

FIG. 3 illustrates an example of a semiconductor system in accordance with an embodiment of the present disclosure to which the stacked semiconductor device illustrated in FIG. 2 is applied.

Referring to FIG. 3, a semiconductor system 100 in accordance with an embodiment of the present disclosure may have a system-on-chip (SOC) structure. The semiconductor system 100 may include a memory device 110, a controller 120, an interposer 130, and a package substrate 140. The memory device 110 may be the same component as the stacked semiconductor device 110 illustrated in FIG. 2. Hence, it may be seen that the memory device 110 of FIG. 3 and the stacked semiconductor device 110 of FIG. 2 have the same reference numeral.

In detail, the memory device 110 may be a volatile memory device such as a dynamic random access memory (DRAM), or may be a nonvolatile memory device such as a flash memory device, a phase change random access memory device (PCRAM), a resistive random access memory device (ReRAM), a ferroelectric random access memory device (FeRAM), a magnetic random access memory device (MRAM) and a spin transfer torque random access memory device (STT-RAM). Alternatively, the memory device 110 may be configured by a combination of at least two among volatile memory devices and nonvolatile memory devices.

Examples of the controller 120 may include a central processing unit (CPU), a graphics processing unit (GPU), a digital signal processor (DSP), an application processor (AP), a controller chip and a memory controller chip.

The memory device 110 and the controller 120 may be stacked on the interposer 130, and may be electrically connected to the interposer 130 through micro bumps 150. The memory device 110 and the controller 120 may communicate with each other through signal paths which are formed in the interposer 130. Interfaces PHY of the memory device 110 and the controller 120 may be connected with each other through the interposer 130.

The interposer 130 may be stacked on the package substrate 140. The interposer 130 and the package substrate 140 may be electrically connected with each other through electrical coupling means 160 such as bump balls and a ball grid array. Signal paths for transmitting signals may be formed in the interposer 130 and the package substrate 140.

Figure 4:
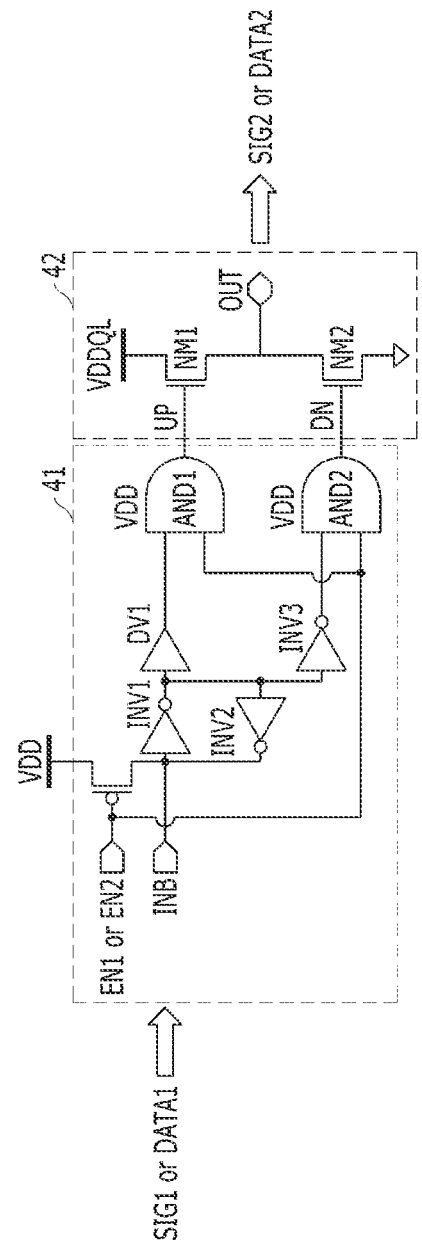
FIG. 4 illustrates an example of a transmitter, illustrated in FIGS. 1 and 2, in accordance with an embodiment of the present disclosure.

FIG. 4 illustrates an example of the transmitter, illustrated in FIGS. 1 and 2, in accordance with an embodiment of the present disclosure.

Referring to FIG. 4, there is illustrated a detailed circuit configuration of an example of the transmitters 14A and 14B (14) included in the semiconductor device SEMICONDUCTOR DEVICE in accordance with the embodiment of the present disclosure described above with reference to FIG. 1 or the transmitters 24A and 24B (24) included in the base die 210 included in the stacked semiconductor device 110 in accordance with the embodiment of the present disclosure described above with reference to FIG. 2.

The first signal SIG1 or the first data DATA1 may be inputted to an input terminal INB of the transmitter 14 or 24 which is connected to the first transmission path 11 or 21 or the second transmission path 12 or 22. The second signal SIG2 or the second data DATA2 may be outputted from an output terminal OUT of the transmitter 14 or 24 which is connected to the third transmission path 13 or 23.

In detail, the transmitter 14 or 24 may include a latch 41 and a transmission driving circuit 42.

The latch 41 may receive the first power supply voltage VDD having the first voltage level LV1 and the ground voltage VSS, and may latch the first signal SIG1 or the first data DATA1 inputted through the first transmission path 11 or 21 or the second transmission path 12 or 22. The latch 41 may be initialized in response to the enable signal EN1 or EN2.

The transmission driving circuit 42 may receive the second power supply voltage VDDQL having the second voltage level LV2 and the ground voltage VSS, and may pull-up drive the third transmission path 13 or 23 to the second power supply voltage VDDQL or pull-down drive the third transmission path 13 or 23 to the ground voltage VSS, according to a signal latched by the latch 41. Also, the transmission driving circuit 42 may drive the third transmission path 13 or 23 to a voltage level corresponding to the preset logic level in response to the enable signal EN1 or EN2.

In more detail, the latch 41 may include two inverters INV1 and INV2 for latching the first signal SIG1 or the first data DATA1 applied through the input terminal INB, and an inverter INV3, a driver DV1 and two AND gates AND1 and AND2 for generating a pull-up control signal UP and a pull-down control signal DN according to the first signal SIG1 or the first data DATA1 latched through the two inverters INV1 and INV2 and the enable signal EN1 or EN2.

The transmission driving circuit 42 may include an NMOS transistor NM1 for driving the output terminal OUT to the second power supply voltage VDDQL in response to the pull-up control signal UP outputted from the latch 41, and an NMOS transistor NM2 for driving the output terminal OUT to the ground voltage VSS in response to the pull-down control signal DN outputted from the latch 41.

In this way, the transmission driving circuit 42 may pull-up and pull-down drive the output terminal OUT, connected to the third transmission path 13 or 23, to the second power supply voltage VDDQL and the ground voltage VSS through the two NMOS transistors NM1 and NM2, respectively. Namely, when the first signal SIG1 or the first data DATA1 which swings between the first voltage level LV1 corresponding to the first power supply voltage VDD and the level of the ground voltage VSS is transferred through the latch 41, the transmission driving circuit 42 may generate the second signal SIG2 or the second data DATA2 which swings between the second voltage level LV2 corresponding to the second power supply voltage VDDQL and the level of the ground voltage VSS.

The latch 41 may initialize a signal or data latched by the two inverters INV1 and INV2, in response to a toggle to a logic 'low' of the enable signal EN1 or EN2. In addition, in response to a toggle to a logic 'low' of the enable signal EN1 or EN2, the latch 41 may deactivate the pull-up control signal UP to the level of the ground voltage VSS and activate the pull-down control signal DN to the first voltage level LV1. Therefore, in response to a toggle to a logic 'low' of the enable signal EN1 or EN2, the transmission driving circuit 42 may pull-down drive the output terminal OUT, connected to the third transmission path 13 or 23, to the level of the ground voltage VSS.

Figure 5:
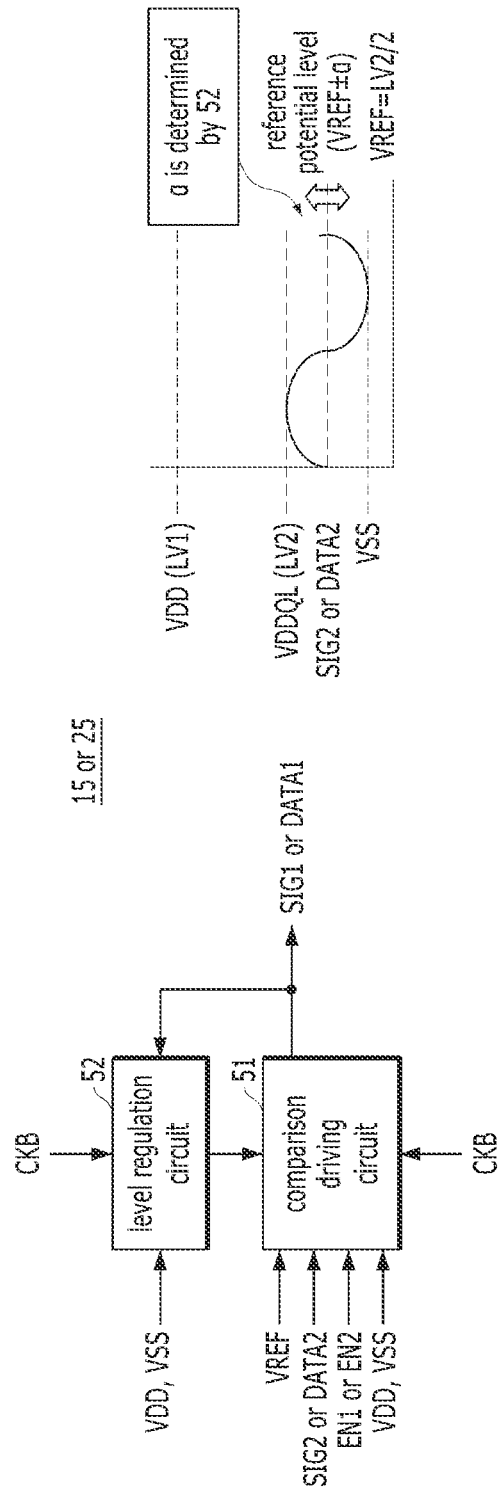
FIGS. 5 and 6 illustrate an example of a receiver, illustrated in FIGS. 1 and 2, in accordance with an embodiment of the present disclosure.
Figure 6:
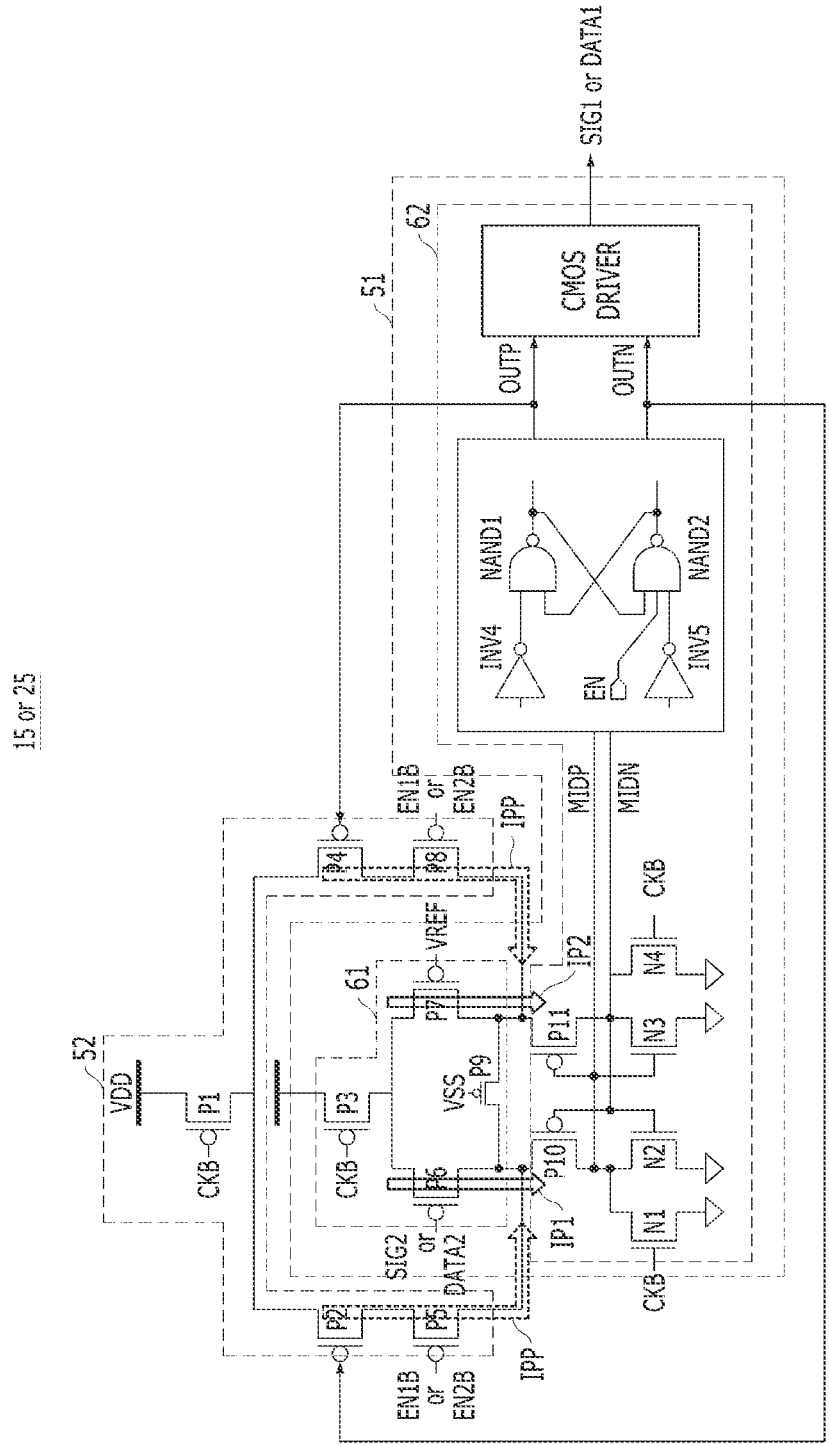

FIGS. 5 and 6 illustrate an example of the receiver, illustrated in FIGS. 1 and 2, in accordance with an embodiment of the present disclosure.

Referring to FIGS. 5 and 6, there is illustrated a detailed circuit configuration of an example of the receivers 15A and 15B (15) included in the semiconductor device SEMICONDUCTOR DEVICE in accordance with the embodiment of the present disclosure described above with reference to FIG. 1 or the receivers 25A and 25B (25) included in the base die 210 included in the stacked semiconductor device 110 in accordance with the embodiment of the present disclosure described above with reference to FIG. 2.

The second signal SIG2 or the second data DATA2 may be inputted to the input terminal of the receiver 15 or 25 which is connected to the third transmission path 13 or 23. The first signal SIG1 or the first data DATA1 may be outputted from the output terminal of the receiver 15 or 25 which is connected to the first transmission path 11 or 21 or the second transmission path 12 or 22.

Referring to FIG. 5, the receiver 15 or 25 may include a comparison driving circuit 51 and a level regulation circuit 52.

The comparison driving circuit 51 may receive the first power supply voltage VDD and the ground voltage VSS, may determine the logic level of the second signal SIG2 or the second data DATA2, inputted through the third transmission path 13 or 23, on the basis of a reference voltage level VREF±α according to a clock signal CKB (see FIG. 6), and may pull-up or pull-down drive the first transmission path 11 or 21 or the second transmission path 12 or 22 to the first power supply voltage VDD or the ground voltage VSS depending on a determination result. Also, the comparison driving circuit 51 may drive the first transmission path 11 or 21 or the second transmission path 12 or 22 to a voltage level corresponding to the preset logic level in response to the enable signal EN1 or EN2.

The level regulation circuit 52 may receive the first power supply voltage VDD and the ground voltage VSS, and may regulate the reference voltage level VREF±α of the comparison driving circuit 51 according to the clock signal CKB by being fed back with the logic level of the first transmission path 11 or 21 or the second transmission path 12 or 22 driven by the comparison driving circuit 51. That is, the level regulation circuit 52 may regulate, according to the clock signal CKB, the reference voltage level VREF±α used as a reference for determining the logic level of the second signal SIG2 or the second data DATA2 to be inputted to the comparison driving circuit 51 according to the logic level of the first transmission path 11 or 21 or the second transmission path 12 or 22 which has already been driven by the comparison driving circuit 51.

The clock signal CKB may be transferred inside the semiconductor device SEMICONDUCTOR DEVICE or the base die 210 through a clock transmission path (not illustrated) separated from the first transmission path 11 or 21, the second transmission path 12 or 22 and the third transmission path 13 or 23, and may be used to sequentially receive the second signal SIG2 or the second data DATA2, by being applied to the receiver 15 or 25.

In more detail, the reference voltage level VREF±α serving as a reference when determining, in the comparison driving circuit 51, the logic level of the second signal SIG2 or the second data DATA2 inputted through the third transmission path 13 or 23 may be determined in its value according to the reference voltage VREF and a signal outputted from the level regulation circuit 52. The reference voltage VREF may have a voltage level LV2/2 corresponding to half of the second voltage level LV2 being the swing level of the second signal SIG2 or the second data DATA2. The comparison driving circuit 51 may increase (+) or decrease (−) the voltage level LV2/2 of the reference voltage VREF by a voltage level α depending on the signal outputted from the level regulation circuit 52.

For example, when the logic level of the first transmission path 11 or 21 or the second transmission path 12 or 22 driven by the comparison driving circuit 51 is a logic 'high,' the level regulation circuit 52 may output the signal which has a first value. Conversely, when the logic level of the first transmission path 11 or 21 or the second transmission path 12 or 22 driven by the comparison driving circuit 51 is a logic 'low,' the level regulation circuit 52 may output the signal which has a second value. When the signal outputted from the level regulation circuit 52 has the first value, the comparison driving circuit 51 may determine the logic level of the second signal SIG2 or the second data DATA2 inputted through the third transmission path 13 or 23, on the basis of the reference voltage level VREF−α decreased (−) by the voltage level α than the voltage level LV2/2 of the reference voltage VREF. Conversely, when the signal outputted from the level regulation circuit 52 has the second value, the comparison driving circuit 51 may determine the logic level of the second signal SIG2 or the second data DATA2 inputted through the third transmission path 13 or 23, on the basis of the reference voltage level VREF+α increased (+) by the voltage level α than the voltage level LV2/2 of the reference voltage VREF.

Referring to FIG. 6, the comparison driving circuit 51 may include a current sourcing circuit 61 and a sensing driving circuit 62.

During an activation period of the clock signal CKB, the current sourcing circuit 61 may regulate an amount of current provided to a first current path IP1 according to the second signal SIG2 or the second data DATA2 inputted through the third transmission path 13 or 23, and may regulate an amount of current provided to a second current path IP2 according to the reference voltage VREF having the voltage level LV2/2 corresponding to half of the second voltage level LV2.

During the activation period of the clock signal CKB, the sensing driving circuit 62 may sense and amplify the difference between amounts of current flowing through the first current path IP1 and the second current path IP2, and thereby, may pull-up or pull-down drive the first transmission path 11 or 21 or the second transmission path 12 or 22 to the first power supply voltage VDD or the ground voltage VSS, respectively. Also, the sensing driving circuit 62 may drive the first transmission path 11 or 21 or the second transmission path 12 or 22 to a voltage level corresponding to the preset logic level in response to the enable signal EN1 or EN2.

During the activation period of the clock signal CKB, the level regulation circuit 52 may provide an additional amount of current IPP to one path of the first current path IP1 and the second current path IP2 depending on the logic level of the first transmission path 11 or 21 or the second transmission path 12 or 22 fed back from the comparison driving circuit 51.

In more detail, the current sourcing circuit 61 may include a PMOS transistor P6 for regulating an amount of current provided to the first current path IP1 according to the second signal SIG2 or the second data DATA2, and a PMOS transistor P7 for regulating an amount of current provided to the second current path IP2 according to the reference voltage VREF.

The sensing driving circuit 62 may include two PMOS transistors P10 and P11 and two NMOS transistors N2 and N3 for sensing the difference between the amounts of current flowing through the first current path IP1 and the second current path IP2, two inverters INV4 and INV5 and two NAND gates NAND1 and NAND2 disposed in an SR (set-reset) latch type to amplify and latch the difference between the amounts of current flowing through the first current path IP1 and the second current path IP2 sensed by the two PMOS transistors P10 and P11 and the two NMOS transistors N2 and N3, and a CMOS driver for pull-up or pull-down driving the first transmission path 11 or 21 or the second transmission path 12 or 22 to the first power supply voltage VDD or the ground voltage VSS, respectively, according to signals OUTP and OUTN outputted from the two inverters INV4 and INV5 and the two NAND gates NAND1 and NAND2 disposed in an SR latch type. The two inverters INV4 and INV5 and the two NAND gates NAND1 and NAND2 included in the sensing driving circuit 62 and disposed in an SR latch type may initialize values of the signals OUTP and OUTN to be outputted, in response to the enable signal EN1 or EN2, and thereby, may control the CMOS driver such that the CMOS driver drives the first transmission path 11 or 21 or the second transmission path 12 or 22 to a voltage level corresponding to the preset logic level.

The level regulation circuit 52 may include two PMOS transistors P2 and P4 for sourcing the additional amount of current IPP to one path of the first current path IP1 and the second current path IP2 according to the signals OUTP and OUTN outputted from the two inverters INV4 and INV5 and the two NAND gates NAND1 and NAND2 included in the sensing driving circuit 62 and disposed in an SR latch type. The level regulation circuit 52 may further include two PMOS transistors P5 and P8 for turning on/off the operation of sourcing the additional amount of current IPP, in response to an inverted enable signal ENB. Accordingly, the level regulation circuit 52 may turn off the operation of sourcing the additional amount of current IPP, when the sensing driving circuit 62 drives the first transmission path 11 or 21 or the second transmission path 12 or 22 to a voltage level corresponding to the preset logic level in response to the enable signal EN1 or EN2.

The current sourcing circuit 61, the sensing driving circuit 62 and the level regulation circuit 52 may include two PMOS transistors P1 and P3 and two NMOS transistors N1 and N4 for blocking generation of the first current path IP1 and the second current path IP2 between a terminal of the power supply voltage VDD and a terminal of the ground voltage VSS according to the clock signal CKB. The operations of the current sourcing circuit 61, the sensing driving circuit 62 and the level regulation circuit 52 may be performed during the activation period of the clock signal CKB.

For reference, the current sourcing circuit 61 may further include a PMOS transistor P9 for electrically connecting the first current path IP1 and the second current path IP2, which may be a component for preventing the sensing driving circuit 62 from malfunctioning due to unpredictable change of the amounts of current of the first current path IP1 and the second current path IP2 during a deactivation period of the clock signal CKB.

FIGS. 7 to 10 illustrate an example of the receiver, illustrated in FIGS. 1 and 2, in accordance with another embodiment of the present disclosure.

Figure 7:
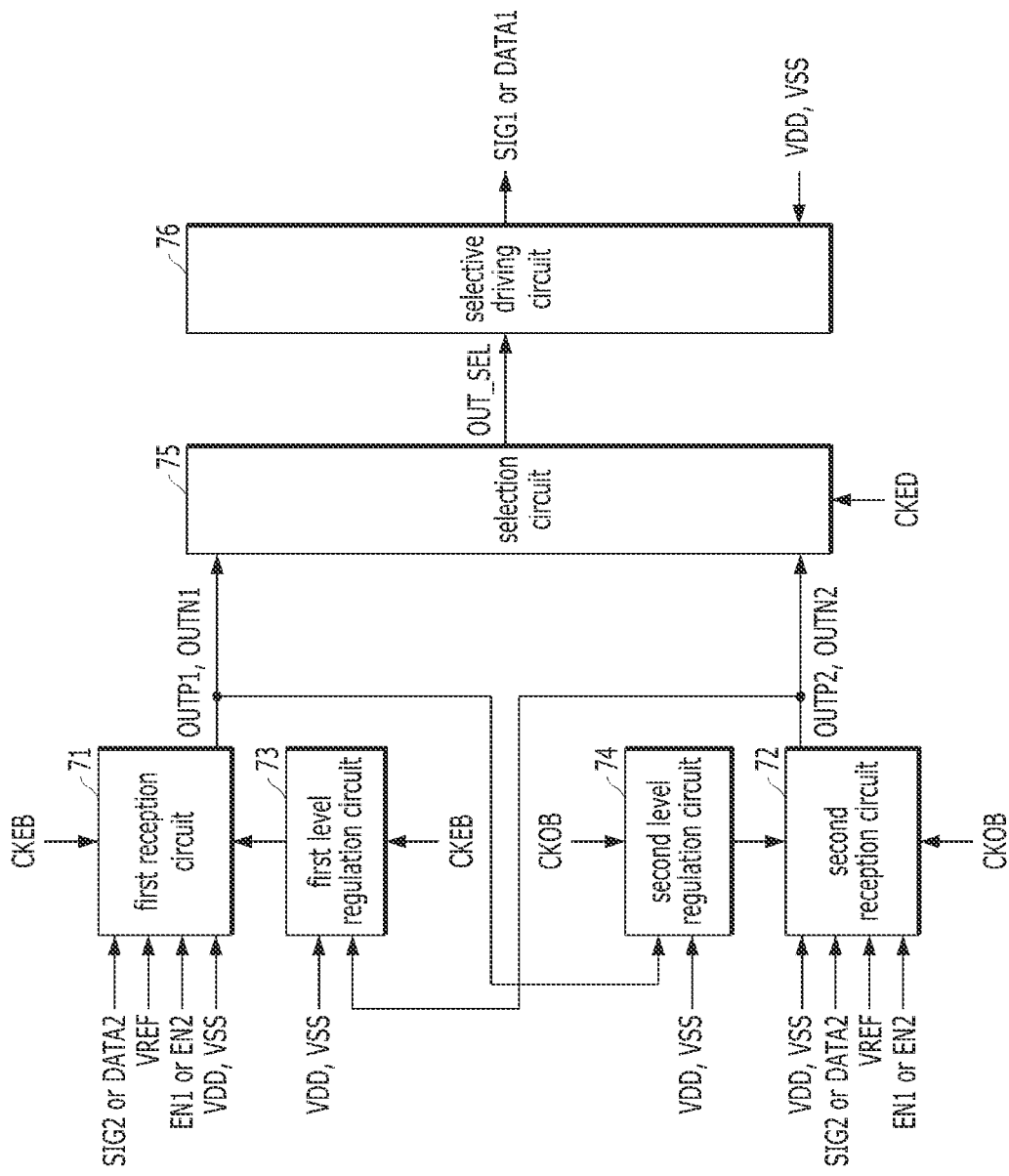
FIGS. 7 to 10 illustrate an example of the receiver, illustrated in FIGS. 1 and 2, in accordance with another embodiment of the present disclosure.
Figure 8:
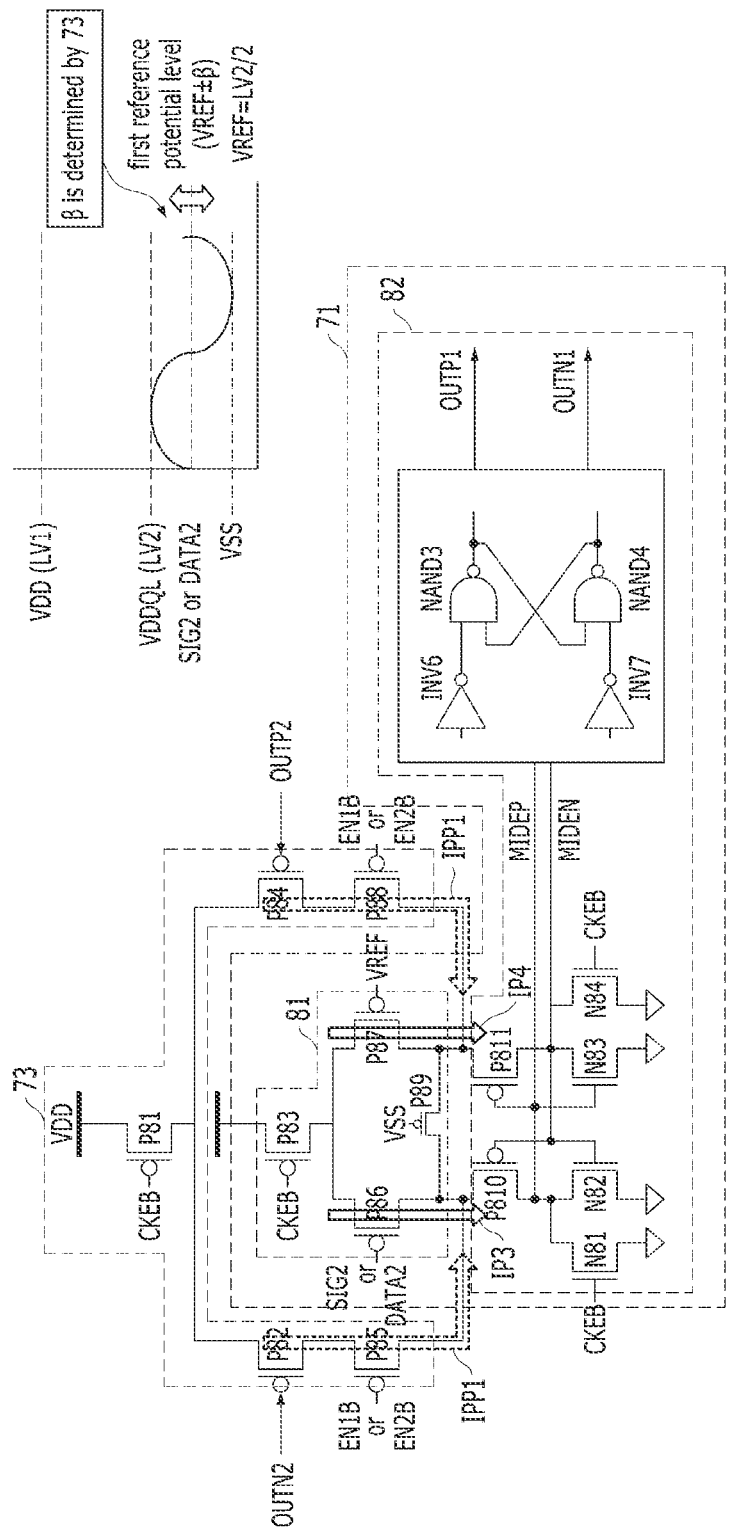
Figure 9:
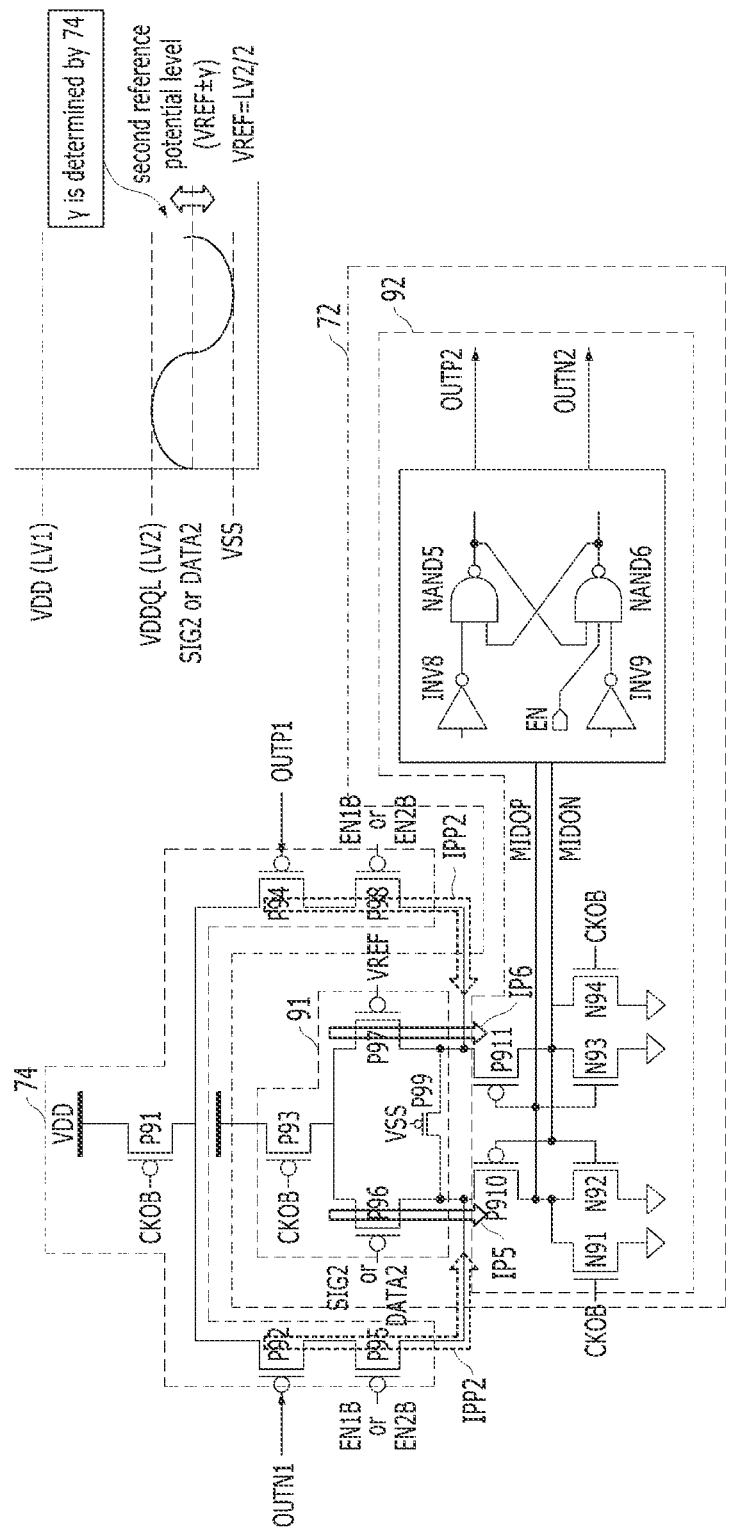

Referring to FIGS. 7 to 9, there is illustrated a detailed circuit configuration of another example of the receivers 15A and 15B (15) included in the semiconductor device SEMICONDUCTOR DEVICE in accordance with the embodiment of the present disclosure described above with reference to FIG. 1 or the receivers 25A and 25B (25) included in the base die 210 included in the stacked semiconductor device 110 in accordance with the embodiment of the present disclosure described above with reference to FIG. 2.

The second signal SIG2 or the second data DATA2 may be inputted to the input terminal of the receiver 15 or 25 which is connected to the third transmission path 13 or 23. The first signal SIG1 or the first data DATA1 may be outputted from the output terminal of the receiver 15 or 25 which is connected to the first transmission path 11 or 21 or the second transmission path 12 or 22.

Referring to FIG. 7, the receiver 15 or 25 may include a first reception circuit 71, a second reception circuit 72, a first level regulation circuit 73, a second level regulation circuit 74, a selection circuit 75, and a selective driving circuit 76.

The first reception circuit 71 may receive the first power supply voltage VDD and the ground voltage VSS, may determine the logic level of the second signal SIG2 or the second data DATA2, inputted through the third transmission path 13 or 23, on the basis of a first reference voltage level VREF±β according to a first clock signal CKEB, and may determine logic levels of first intermediate signals or first intermediate data OUTP1 and OUTN1 according to a determination result.

The second reception circuit 72 may receive the first power supply voltage VDD and the ground voltage VSS, may determine the logic level of the second signal SIG2 or the second data DATA2, inputted through the third transmission path 13 or 23, on the basis of a second reference voltage level VREF±γ according to a second clock signal CKOB, and may determine logic levels of second intermediate signals or second intermediate data OUTP2 and OUTN2 according to a determination result. The second reception circuit 72 may initialize logic levels of the second intermediate signals or the second intermediate data OUTP2 and OUTN2 in response to the enable signal EN1 or EN2.

The first level regulation circuit 73 may receive the first power supply voltage VDD and the ground voltage VSS, and may regulate the first reference voltage level VREF±β depending on logic levels of the second intermediate signals or the second intermediate data OUTP2 and OUTN2, fed back from the second reception circuit 72, according to the first clock signal CKEB. Namely, the first level regulation circuit 73 may regulate, according to the first clock signal CKEB, the first reference voltage level VREF±β used as a reference for determining the logic level of the second signal SIG2 or the second data DATA2, to be inputted to the first reception circuit 71, on the basis of the second intermediate signals or the second intermediate data OUTP2 and OUTN2 whose logic levels are determined in the second reception circuit 72.

The second level regulation circuit 74 may receive the first power supply voltage VDD and the ground voltage VSS, and may regulate the second reference voltage level VREF±γ depending on logic levels of the first intermediate signals or the first intermediate data OUTP1 and OUTN1, fed back from the first reception circuit 71, according to the second clock signal CKOB. Namely, the second level regulation circuit 74 may regulate, according to the second clock signal CKOB, the second reference voltage level VREF±γ used as a reference for determining the logic level of the second signal SIG2 or the second data DATA2, to be inputted to the second reception circuit 72, on the basis of the first intermediate signals or the first intermediate data OUTP1 and OUTN1 whose logic levels are determined in the first reception circuit 71.

According to a clock CKED which is generated by delaying the first clock signal CKEB by a preset time, the selection circuit 75 may select one of the first intermediate signals or the first intermediate data OUTP1 and OUTN1 and the second intermediate signals or the second intermediate data OUTP2 and OUTN2, and thereby, may output an output signal OUT_SEL.

The selective driving circuit 76 may receive the first power supply voltage VDD and the ground voltage VSS, and according to the output signal OUT_SEL of the selection circuit 75, may pull-up or pull-down drive the first transmission path 11 or 21 or the second transmission path 12 or 22 to the first power supply voltage VDD or the ground voltage VSS, respectively.

Although not illustrated in detail in the drawing, by dividing one clock signal CKB toggling at a first frequency into two, the first clock signal CKEB and the second clock signal CKOB which toggle at a second frequency two times lower than the first frequency may be generated. Namely, the first clock signal CKEB may be generated in correspondence to the odd-numbered edge of the clock signal CKB, and the second clock signal CKOB may be generated in correspondence to the even-numbered edge of the clock signal CKB. Therefore, the first clock signal CKEB and the second clock signal CKOB may have a phase difference of 180 degrees. The first clock signal CKEB may be activated earlier than the second clock signal CKOB. The delayed clock CKED and the first clock signal CKEB may have a phase difference of 90 degrees. That is, the delayed clock CKED and the second clock signal CKOB may have a phase difference of 90 degrees.

The clock signal CKB may be transferred inside the semiconductor device SEMICONDUCTOR DEVICE or the base die 210 through a clock transmission path (not illustrated) separated from the first transmission path 11 or 21, the second transmission path 12 or 22 and the third transmission path 13 or 23, and may be used to sequentially receive the second signal SIG2 or the second data DATA2, by being applied as the first clock signal CKEB, the second clock signal CKOB and the delayed clock CKED to the receiver 15 or 25.

In more detail, the first reference voltage level VREF±β serving as a reference when determining, in the first reception circuit 71, the logic level of the second signal SIG2 or the second data DATA2 inputted through the third transmission path 13 or 23 may be determined in its value according to the reference voltage VREF and a signal outputted from the first level regulation circuit 73. The reference voltage VREF may have a voltage level LV2/2 corresponding to half of the second voltage level LV2 being the swing level of the second signal SIG2 or the second data DATA2. The first reception circuit 71 may increase (+) or decrease (−) the voltage level LV2/2 of the reference voltage VREF by a voltage level β depending on the signal outputted from the first level regulation circuit 73.

For example, when, of the second intermediate signals or the second intermediate data OUTP2 and OUTN2 fed back from the second reception circuit 72, the logic level of a P signal OUTP2 is a logic 'high' and the logic level of an N signal OUTN2 is a logic 'low,' the first level regulation circuit 73 may output a signal which has a first value. Conversely, when, of the second intermediate signals or the second intermediate data OUTP2 and OUTN2 fed back from the second reception circuit 72, the logic level of the P signal OUTP2 is a logic 'low' and the logic level of the N signal OUTN2 is a logic 'high,' the first level regulation circuit 73 may output a signal which has a second value. When the signal outputted from the first level regulation circuit 73 has the first value, the first reception circuit 71 may determine the logic level of the second signal SIG2 or the second data DATA2 inputted through the third transmission path 13 or 23, on the basis of the first reference voltage level VREF−β decreased (−) by the voltage level β than the voltage level LV2/2 of the reference voltage VREF. Conversely, when the signal outputted from the first level regulation circuit 73 has the second value, the first reception circuit 71 may determine the logic level of the second signal SIG2 or the second data DATA2 inputted through the third transmission path 13 or 23, on the basis of the first reference voltage level VREF+β increased (+) by the voltage level β than the voltage level LV2/2 of the reference voltage VREF.

Further, the second reference voltage level VREF±γ serving as a reference when determining, in the second reception circuit 72, the logic level of the second signal SIG2 or the second data DATA2 inputted through the third transmission path 13 or 23 may be determined in its value according to the reference voltage VREF and a signal outputted from the second level regulation circuit 74. The reference voltage VREF may have a voltage level LV2/2 corresponding to half of the second voltage level LV2 being the swing level of the second signal SIG2 or the second data DATA2. The second reception circuit 72 may increase (+) or decrease (−) the voltage level LV2/2 of the reference voltage VREF by a voltage level γ depending on the signal outputted from the second level regulation circuit 74.

For example, when, of the first intermediate signals or the first intermediate data OUTP1 and OUTN1 fed back from the first reception circuit 71, the logic level of a P signal OUTP1 is a logic 'high' and the logic level of an N signal OUTN1 is a logic 'low,' the second level regulation circuit 74 may output a signal which has a first value. Conversely, when, of the first intermediate signals or the first intermediate data OUTP1 and OUTN1 fed back from the first reception circuit 71, the logic level of the P signal OUTP1 is a logic 'low' and the logic level of the N signal OUTN1 is a logic 'high,' the second level regulation circuit 74 may output a signal which has a second value. When the signal outputted from the second level regulation circuit 74 has the first value, the second reception circuit 72 may determine the logic level of the second signal SIG2 or the second data DATA2 inputted through the third transmission path 13 or 23, on the basis of the second reference voltage level VREF−γ decreased (−) by the voltage level γ than the voltage level LV2/2 of the reference voltage VREF. Conversely, when the signal outputted from the second level regulation circuit 74 has the second value, the second reception circuit 72 may determine the logic level of the second signal SIG2 or the second data DATA2 inputted through the third transmission path 13 or 23, on the basis of the second reference voltage level VREF+γ increased (+) by the voltage level γ than the voltage level LV2/2 of the reference voltage VREF.

As described above, the first reception circuit 71 may determine the first reference voltage level VREF±β according to the output signal of the first level regulation circuit 73 whose value is determined depending on the logic levels of the second intermediate signals or the second intermediate data OUTP2 and OUTN2 fed back from the second reception circuit 72. The second reception circuit 72 may determine the second reference voltage level VREF±γ according to the output signal of the second level regulation circuit 74 whose value is determined depending on the logic levels of the first intermediate signals or the first intermediate data OUTP1 and OUTN1 fed back from the first reception circuit 71. The first reception circuit 71 and the first level regulation circuit 73 may operate according to the first clock signal CKEB, and the second reception circuit 72 and the second level regulation circuit 74 may operate according to the second clock signal CKOB which has a phase difference of 180 degrees from the first clock signal CKEB and is activated relatively later than the first clock signal CKEB. In this way, the first reception circuit 71 and the first level regulation circuit 73, and the second reception circuit 72 and the second level regulation circuit 74 may operate alternately with each other. Therefore, it may be seen that, in order for the operation of a decision feedback equalizer (DFE) to be normally performed, the first intermediate signals or the first intermediate data OUTP1 and OUTN1 fed back from the first reception circuit 71 should be applied to the second level regulation circuit 74 and the second intermediate signals or the second intermediate data OUTP2 and OUTN2 fed back from the second reception circuit 72 should be applied to the first level regulation circuit 73.

Referring to FIG. 8, the first reception circuit 71 may include a first current sourcing circuit 81 and a first sensing output circuit 82.

During an activation period of the first clock signal CKEB, the first current sourcing circuit 81 may regulate an amount of current provided to a third current path IP3 according to the second signal SIG2 or the second data DATA2 inputted through the third transmission path 13 or 23, and may regulate an amount of current provided to a fourth current path IP4 according to the reference voltage VREF having the voltage level LV2/2 corresponding to half of the second voltage level LV2.

During the activation period of the first clock signal CKEB, the first sensing output circuit 82 may sense and amplify the difference between amounts of current flowing through the third current path IP3 and the fourth current path IP4, and thereby, may determine logic levels of the first intermediate signals or the first intermediate data OUTP1 and OUTN1.

During the activation period of the first clock signal CKEB, the first level regulation circuit 73 may provide an additional amount of current IPP1 to one path of the third current path IP3 and the fourth current path IP4 depending on logic levels of the second intermediate signals or the second intermediate data OUTP2 and OUTN2 fed back from the second reception circuit 72.

In more detail, the first current sourcing circuit 81 may include a PMOS transistor P86 for regulating an amount of current provided to the third current path IP3 according to the second signal SIG2 or the second data DATA2, and a PMOS transistor P87 for regulating an amount of current provided to the fourth current path IP4 according to the reference voltage VREF.

The first sensing output circuit 82 may include two PMOS transistors P810 and P811 and two NMOS transistors N82 and N83 for sensing the difference between the amounts of current flowing through the third current path IP3 and the fourth current path IP4, and two inverters INV6 and INV7 and two NAND gates NAND3 and NAND4 disposed in an SR latch type to amplify and latch the difference between the amounts of current flowing through the third current path IP3 and the fourth current path IP4, sensed by the two PMOS transistors P810 and P811 and the two NMOS transistors N82 and N83, and then output the first intermediate signals or the first intermediate data OUTP1 and OUTN1.

The first level regulation circuit 73 may include two PMOS transistors P82 and P84 for sourcing the additional amount of current IPP1 to one path of the third current path IP3 and the fourth current path IP4 according to the second intermediate signals or the second intermediate data OUTP2 and OUTN2 outputted from the second reception circuit 72. The first level regulation circuit 73 may further include two PMOS transistors P85 and P88 for turning on/off the operation of sourcing the additional amount of current IPP1, in response to an inverted enable signal ENB. Accordingly, the first level regulation circuit 73 may turn off the operation of sourcing the additional amount of current IPP1, when the second reception circuit 72 initializes the logic levels of the second intermediate signals or the second intermediate data OUTP2 and OUTN2 in response to the enable signal EN1 or EN2.

The first current sourcing circuit 81, the first sensing output circuit 82 and the first level regulation circuit 73 may include two PMOS transistors P81 and P83 and two NMOS transistors N81 and N84 for blocking generation of the third current path IP3 and the fourth current path IP4 between a terminal of the power supply voltage VDD and a terminal of the ground voltage VSS according to the first clock signal CKEB. The operations of the first current sourcing circuit 81, the first sensing output circuit 82 and the first level regulation circuit 73 may be performed during the activation period of the first clock signal CKEB.

For reference, the first current sourcing circuit 81 may further include a PMOS transistor P89 for electrically connecting the third current path IP3 and the fourth current path IP4, which may be a component for preventing the first sensing output circuit 82 from malfunctioning due to unpredictable change of the amounts of current of the third current path IP3 and the fourth current path IP4 during a deactivation period of the first clock signal CKEB.

Referring to FIG. 9, the second reception circuit 72 may include a second current sourcing circuit 91 and a second sensing output circuit 92.

During an activation period of the second clock signal CKOB, the second current sourcing circuit 91 may regulate an amount of current provided to a fifth current path IP5 according to the second signal SIG2 or the second data DATA2 inputted through the third transmission path 13 or 23, and may regulate an amount of current provided to a sixth current path IP6 according to the reference voltage VREF having the voltage level LV2/2 corresponding to half of the second voltage level LV2.

During the activation period of the second clock signal CKOB, the second sensing output circuit 92 may sense and amplify the difference between amounts of current flowing through the fifth current path IP5 and the sixth current path IP6, and thereby, may determine logic levels of the second intermediate signals or the second intermediate data OUTP2 and OUTN2. The second sensing output circuit 92 may initialize logic levels of the second intermediate signals or the second intermediate data OUTP2 and OUTN2 in response to the enable signal EN1 or EN2.

During the activation period of the second clock signal CKOB, the second level regulation circuit 74 may provide an additional amount of current IPP2 to one path of the fifth current path IP5 and the sixth current path IP6 depending on logic levels of the first intermediate signals or the first intermediate data OUTP1 and OUTN1 fed back from the first reception circuit 71.

In more detail, the second current sourcing circuit 91 may include a PMOS transistor P96 for regulating an amount of current provided to the fifth current path IP5 according to the second signal SIG2 or the second data DATA2, and a PMOS transistor P97 for regulating an amount of current provided to the sixth current path IP6 according to the reference voltage VREF.

The second sensing output circuit 92 may include two PMOS transistors P910 and P911 and two NMOS transistors N92 and N93 for sensing the difference between the amounts of current flowing through the fifth current path IP5 and the sixth current path IP6, and two inverters INV8 and INV9 and two NAND gates NAND5 and NAND6 disposed in an SR latch type to amplify and latch the difference between the amounts of current flowing through the fifth current path IP5 and the sixth current path IP6, sensed by the two PMOS transistors P910 and P911 and the two NMOS transistors N92 and N93, and then output the second intermediate signals or the second intermediate data OUTP2 and OUTN2. The two inverters INV8 and INV9 and the two NAND gates NAND5 and NAND6 included in the second sensing output circuit 92 and disposed in an SR latch type may initialize values of the second intermediate signals or the second intermediate data OUTP2 and OUTN2 outputted in response to the enable signal EN1 or EN2.

The second level regulation circuit 74 may include two PMOS transistors P92 and P94 for sourcing the additional amount of current IPP2 to one path of the fifth current path IP5 and the sixth current path IP6 according to the first intermediate signals or the first intermediate data OUTP1 and OUTN1 outputted from the first reception circuit 71. The second level regulation circuit 74 may further include two PMOS transistors P95 and P98 for turning on/off the operation of sourcing the additional amount of current IPP2, in response to the inverted enable signal ENB. Accordingly, the second level regulation circuit 74 may turn off the operation of sourcing the additional amount of current IPP2, when the second sensing output circuit 92 initializes values of the second intermediate signals or the second intermediate data OUTP2 and OUTN2 in response to the enable signal EN1 or EN2.

The second current sourcing circuit 91, the second sensing output circuit 92 and the second level regulation circuit 74 may include two PMOS transistors P91 and P93 and two NMOS transistors N91 and N94 for blocking generation of the fifth current path IP5 and the sixth current path IP6 between a terminal of the power supply voltage VDD and a terminal of the ground voltage VSS according to the second clock signal CKOB. The operations of the second current sourcing circuit 91, the second sensing output circuit 92 and the second level regulation circuit 74 may be performed during the activation period of the second clock signal CKOB.

For reference, the second current sourcing circuit 91 may further include a PMOS transistor P99 for electrically connecting the fifth current path IP5 and the sixth current path IP6, which may be a component for preventing the second sensing output circuit 92 from malfunctioning due to unpredictable change of the amounts of current of the fifth current path IP5 and the sixth current path IP6 during a deactivation period of the second clock signal CKOB.

Referring to FIGS. 8 and 9 together, it may be seen that the second intermediate signals or the second intermediate data OUTP2 and OUTN2 outputted from the second reception circuit 72 are initialized in response to the enable signal EN1 or EN2 but the first intermediate signals or the first intermediate data OUTP1 and OUTN1 outputted from the first reception circuit 71 are not initialized in response to the enable signal EN1 or EN2. The reason why, as such, the operations of the first reception circuit 71 and the second reception circuit 72 have a difference is because the first reception circuit 71 operates according to the first clock signal CKEB and the second reception circuit 72 operates according to the second clock signal CKOB which has a phase difference of 180 degrees from the first clock signal CKEB and is activated relatively later than the first clock signal CKEB. That is, since the first clock signal CKEB is activated earlier than the second clock signal CKOB after the initialization operation, the first reception circuit 71 may start the operation earlier than the second reception circuit 72 after the initialization operation. Therefore, when only the feedback signals of the second reception circuit 72 necessary for the operation of the first reception circuit 71, that is, the second intermediate signals or the second intermediate data OUTP2 and OUTN2, are initialized, the first reception circuit 71 may normally operate. At a time point when the second reception circuit 72 starts the operation after the initialization operation, the operation of the first reception circuit 71 may be completed. The feedback signals necessary for the operation of the second reception circuit 72 after the initialization operation, that is, the first intermediate signals or the first intermediate data OUTP1 and OUTN1, may be generated by the operation of the first reception circuit 71. Thus, the first intermediate signals or the first intermediate data OUTP1 and OUTN1 outputted from the first reception circuit 71 do not need to be initialized in response to the enable signal EN1 or EN2.

Figure 10:
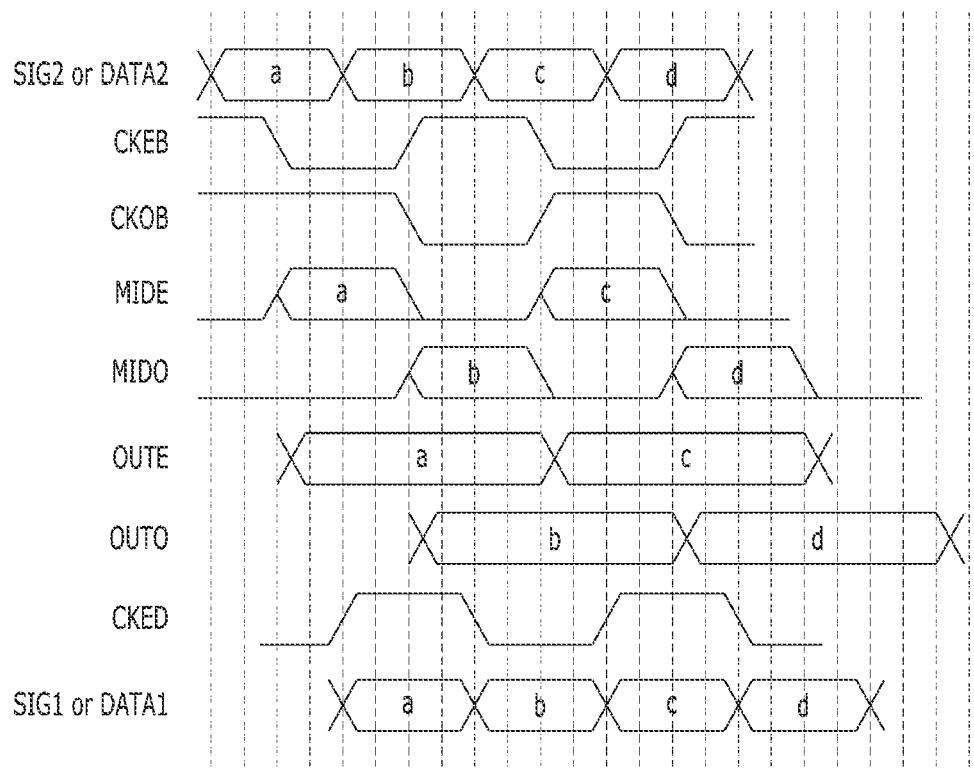

Referring to FIG. 10, an operation according to another example of the receiver 15 or 25 described above with reference to FIGS. 7 to 9 may be seen.

First, the second signal SIG2 or the second data DATA2 having values of 'a b c d' may be sequentially inputted to the input terminal of the receiver 15 or 25 connected to the third transmission path 13 or 23.

The fact that the second signal SIG2 or the second data DATA2 is sequentially inputted may mean that the second signal SIG2 or the second data DATA2 is inputted in a state in which the second signal SIG2 or the second data DATA2 is synchronized with the edge of each of the first clock signal CKEB and the second clock signal CKOB having a phase difference of 180 degrees from each other.

In detail, the second signal SIG2 or the second data DATA2 having the value of 'a' may be applied at a first falling edge of the first clock signal CKEB which is activated relatively earlier. During a first activation period of the first clock signal CKEB, the second signal SIG2 or the second data DATA2 having the value of 'a' may be sensed and amplified (MIDE). The second signal SIG2 or the second data DATA2 having the value of 'a,' which is sensed and amplified (MIDE) during the first activation period of the first clock signal CKEB, may be outputted as the first intermediate signals or the first intermediate data OUTP1 and OUTN1 (OUTE) in a state in which the second signal SIG2 or the second data DATA2 is latched through an SR latch till a second falling edge of the first clock signal CKEB. In this way, while the second signal SIG2 or the second data DATA2 is outputted as the first intermediate signals or the first intermediate data OUTP1 and OUTN1 (OUTE) from the first falling edge to the second falling edge of the first clock signal CKEB, the second signal SIG2 or the second data DATA2 may be selected during a logic high period of the clock CKED generated by delaying the first clock signal CKEB by the preset time, and thereby, may be driven to the first transmission path 11 or 21 or the second transmission path 12 or 22 as the first signal SIG1 or the first data DATA1.

In succession, at a first falling edge of the second clock signal CKOB, the second signal SIG2 or the second data DATA2 having the value of 'b' may be applied. During a first activation period of the second clock signal CKOB, the second signal SIG2 or the second data DATA2 having the value of 'b' may be sensed and amplified (MIDO). The second signal SIG2 or the second data DATA2 having the value of 'b,' which is sensed and amplified (MIDO) during the first activation period of the second clock signal CKOB, may be outputted as the second intermediate signals or the second intermediate data OUTP2 and OUTN2 (OUTO) in a state in which the second signal SIG2 or the second data DATA2 is latched through an SR latch till a second falling edge of the second clock signal CKOB. In this way, while the second signal SIG2 or the second data DATA2 is outputted as the second intermediate signals or the second intermediate data OUTP2 and OUTN2 (OUTO) from the first falling edge to the second falling edge of the second clock signal CKOB, the second signal SIG2 or the second data DATA2 may be selected during a logic low period of the clock CKED generated by delaying the first clock signal CKEB by the preset time, and thereby, may be driven to the first transmission path 11 or 21 or the second transmission path 12 or 22 as the first signal SIG1 or the first data DATA1.

In succession, at a second falling edge of the first clock signal CKEB, the second signal SIG2 or the second data DATA2 having the value of 'c' may be applied. During a second activation period of the first clock signal CKEB, the second signal SIG2 or the second data DATA2 having the value of 'c' may be sensed and amplified (MIDE). The second signal SIG2 or the second data DATA2 having the value of 'c,' which is sensed and amplified (MIDE) during the second activation period of the first clock signal CKEB, may be outputted as the first intermediate signals or the first intermediate data OUTP1 and OUTN1 (OUTE) in a state in which the second signal SIG2 or the second data DATA2 is latched through the SR latch till a third falling edge of the first clock signal CKEB. In this way, while the second signal SIG2 or the second data DATA2 is outputted as the first intermediate signals or the first intermediate data OUTP1 and OUTN1 (OUTE) from the second falling edge to the third falling edge of the first clock signal CKEB, the second signal SIG2 or the second data DATA2 may be selected during a logic high period of the clock CKED generated by delaying the first clock signal CKEB by the preset time, and thereby, may be driven to the first transmission path 11 or 21 or the second transmission path 12 or 22 as the first signal SIG1 or the first data DATA1.

In succession, at a second falling edge of the second clock signal CKOB, the second signal SIG2 or the second data DATA2 having the value of 'd' may be applied. During a second activation period of the second clock signal CKOB, the second signal SIG2 or the second data DATA2 having the value of 'd' may be sensed and amplified (MIDO). The second signal SIG2 or the second data DATA2 having the value of 'd,' which is sensed and amplified (MIDO) during the second activation period of the second clock signal CKOB, may be outputted as the second intermediate signals or the second intermediate data OUTP2 and OUTN2 (OUTO) in a state in which the second signal SIG2 or the second data DATA2 is latched through the SR latch till a third falling edge of the second clock signal CKOB. In this way, while the second signal SIG2 or the second data DATA2 is outputted as the second intermediate signals or the second intermediate data OUTP2 and OUTN2 (OUTO) from the second falling edge to the third falling edge of the second clock signal CKOB, the second signal SIG2 or the second data DATA2 may be selected during a logic low period of the clock CKED generated by delaying the first clock signal CKEB by the preset time, and thereby, may be driven to the first transmission path 11 or 21 or the second transmission path 12 or 22 as the first signal SIG1 or the first data DATA1.

Although various embodiments have been described for illustrative purposes, it will be apparent to those skilled in the art that various changes and modifications may be made without departing from the spirit and scope of the disclosure as defined in the following claims.

For instance, positions and kinds of the logic gates and transistors described as an example in the above embodiment should be differently realized according to the polarities of the signals inputted thereto. Furthermore, the embodiments may be combined to form additional embodiments.

What is claimed is:
1. A semiconductor device comprising:
a first circuit configured to generate a transfer signal by decreasing an amplitude of an input signal provided through a first interface and configured to transfer the transfer signal through a transfer path; and
a second circuit configured to generate an output signal by increasing an amplitude of the transfer signal transferred through the transfer path and configured to output the output signal through a second interface,
wherein the second circuit includes a decision feedback equalizer (DFE) configured to regulate a reference level for determining a logic level of the transfer signal.

2. The semiconductor device of claim 1, wherein the first circuit is configured to initialize a first output terminal coupled to the transfer path thereof in response to an enable signal.

3. The semiconductor device of claim 2, wherein the second circuit is configured to initialize a second output terminal coupled to the second interface thereof in response to the enable signal.

4. The semiconductor device of claim 3,
wherein each of the input signal and the output signal swings between a ground level and a first voltage level,
wherein the transfer signal swings between the ground level and a second voltage level lower than the first voltage level,
wherein the first circuit comprises:
a latch configured to:
receive a first power supply voltage having the first voltage level and a ground voltage,
latch the input signal provided through the first interface, and
be initialized in response to the enable signal; and
a transmission driving circuit configured to:
receive a second power supply voltage having the second voltage level and the ground voltage,
pull-up or pull-down drive the first output terminal to the second power supply voltage or the ground voltage, respectively, according to a signal latched by the latch, and
drive the first output terminal to a voltage level corresponding to a preset logic level in response to the enable signal.

5. The semiconductor device of claim 4, wherein the second circuit comprises:
a comparison driving circuit configured to:
receive the first power supply voltage and the ground voltage,
determine a logic level of the transfer signal, which is transferred through the transfer path, on the basis of the reference level according to a clock signal,
pull-up or pull-down drive the second output terminal to the first power supply voltage or the ground voltage, respectively, depending on a determination result, and
drive the second output terminal to a voltage level corresponding to a preset logic level in response to the enable signal; and
a level regulation circuit configured to:
receive the first power supply voltage and the ground voltage, and
regulate the reference level according to the clock signal and the feed-back logic level of the second output terminal driven by the comparison driving circuit.

6. The semiconductor device of claim 5, wherein the comparison driving circuit comprises:
a current sourcing circuit configured to:
regulate, during an activation period of the clock signal, an amount of current provided to a first current path according to the transfer signal transferred through the transfer path, and
regulate, during the activation period, an amount of current provided to a second current path according to the reference voltage having a voltage level corresponding to half of the second voltage level; and
a sensing driving circuit configured to:
pull-up or pull-down drive, during the activation period, the second output terminal to the first power supply voltage or the ground voltage, respectively, by sensing and amplifying a difference between amounts of current flowing through the first and second current paths, and
drive, during the activation period, the second output terminal to a voltage level corresponding to the preset logic level in response to the enable signal.

7. The semiconductor device of claim 6, wherein the level regulation circuit provides, during the activation period, an additional amount of current to one path of the first and second current paths depending on a logic level of the second output terminal feed back from the comparison driving circuit.

8. The semiconductor device of claim 1, further comprising:
a plurality of stacked memory dies;
a controller configured to control the plurality of memory dies; and
a base die including the first circuit and the second circuit, and configured to electrically connect the plurality of memory dies and the controller.

9. A semiconductor device comprising:
a base die;
a plurality of memory dies stacked on the base die; and
a controller configured to control the plurality of memory dies through the base die,
wherein the base die comprises:
a first circuit configured to:
receive a input signal provided through a first interface,
generate a transfer signal by decreasing an amplitude of the input signal, and
output the transfer signal to a transfer path; and
a second circuit configured to:
receive the transfer signal transferred through the transfer path,
generate a output signal by increasing an amplitude of the transfer signal,
output the output signal to a second interface, and
regulate a reference level for determining a logic level of the transfer signal according to a feed-back logic level of the output signal.

10. The semiconductor device of claim 9, wherein the first circuit is configured to initialize a first output terminal coupled to the transfer path thereof in response to an enable signal.

11. The semiconductor device of claim 10, wherein the second circuit is configured to initialize a second output terminal coupled to the second interface thereof in response to the enable signal.

12. The semiconductor device of claim 11,
wherein each of the input signal and the output signal swings between a ground level and a first voltage level,
wherein the transfer signal swings between the ground level and a second voltage level lower than the first voltage level,
wherein the first circuit comprises:
a latch configured to:
receive a first power supply voltage having the first voltage level and a ground voltage,
latch the input signal provided through the first interface, and
be initialized in response to the enable signal; and
a transmission driving circuit configured to:
receive a second power supply voltage having the second voltage level and the ground voltage,
pull-up or pull-down drive the first output terminal to the second power supply voltage or the ground voltage, respectively, according to a signal latched by the latch, and
drive the first output terminal to a voltage level corresponding to a preset logic level in response to the enable signal.

13. The semiconductor device of claim 12, wherein the second circuit comprises:
a comparison driving circuit configured to:
receive the first power supply voltage and the ground voltage,
determine a logic level of the transfer signal, which is transferred through the transfer path, on the basis of the reference level according to a clock signal,
pull-up or pull-down drive the second output terminal to the first power supply voltage or the ground voltage, respectively, depending on a determination result, and
drive the second output terminal to a voltage level corresponding to a preset logic level in response to the enable signal; and
a level regulation circuit configured to:
receive the first power supply voltage and the ground voltage, and
regulate the reference level according to the clock signal and the feed-back logic level of the second output terminal driven by the comparison driving circuit.

14. The semiconductor device of claim 13, wherein the comparison driving circuit comprises:
a current sourcing circuit configured to:
regulate, during an activation period of the clock signal, an amount of current provided to a first current path according to the transfer signal transferred through the transfer path, and
regulate, during the activation period, an amount of current provided to a second current path according to the reference voltage having a voltage level corresponding to half of the second voltage level; and
a sensing driving circuit configured to:
pull-up or pull-down drive, during the activation period, the second output terminal to the first power supply voltage or the ground voltage, respectively, by sensing and amplifying a difference between amounts of current flowing through the first and second current paths, and
drive, during the activation period, the second output terminal to a voltage level corresponding to the preset logic level in response to the enable signal.

15. The semiconductor device of claim 14, wherein the level regulation circuit provides, during the activation period, an additional amount of current to one path of the first and second current paths depending on a logic level of the second output terminal feed back from the comparison driving circuit.

* * * * *